(12) United States Patent
Ankoudinov et al.

(10) Patent No.: US 8,643,055 B2
(45) Date of Patent: Feb. 4, 2014

(54) SERIES CURRENT LIMITER DEVICE

(75) Inventors: Alexei Ankoudinov, Redmond, WA (US); Vladimir Rodov, Seattle, WA (US); Richard A. Blanchard, Los Altos, CA (US)

(73) Assignee: STMicroelectronics N.V., Amsterdam (NL)

( * ) Notice: Subject to any disclaimer, the term of this patent is extended or adjusted under 35 U.S.C. 154(b) by 639 days.

(21) Appl. No.: 12/773,003

(22) Filed: May 3, 2010

(65) Prior Publication Data
US 2011/0051305 A1    Mar. 3, 2011

Related U.S. Application Data

(63) Continuation of application No. 12/683,425, filed on Jan. 6, 2010, and a continuation of application No. 12/431,580, filed on Apr. 28, 2009, and a continuation of application No. 12/359,094, filed on Jan. 23, 2009, now Pat. No. 8,421,118, and a continuation of application No. 12/238,308, filed on Sep. 25, 2008, now Pat. No. 8,148,748.

(60) Provisional application No. 61/174,865, filed on May 1, 2009, provisional application No. 61/142,647, filed on Jan. 6, 2009, provisional application No. 61/048,336, filed on Apr. 28, 2008, provisional application No. 61/022,968, filed on Jan. 23, 2008, provisional application No. 60/975,467, filed on Sep. 26, 2007, provisional application No. 61/048,336, filed on Apr. 28, 2008.

(51) Int. Cl.
*H01L 29/66* (2006.01)

(52) U.S. Cl.
USPC .......................................................... 257/124

(58) Field of Classification Search
USPC .......................................... 361/111; 257/124
See application file for complete search history.

(56) References Cited

U.S. PATENT DOCUMENTS

| | | |
|---|---|---|
| 3,602,777 A | 8/1971 | Berman |
| 3,603,811 A | 9/1971 | Day et al. |
| 4,281,448 A | 8/1981 | Barry et al. |
| 4,373,252 A | 2/1983 | Caldwell |
| 4,533,970 A | 8/1985 | Brown |

(Continued)

FOREIGN PATENT DOCUMENTS

| | | |
|---|---|---|
| EP | 0322400 A2 | 6/1989 |
| EP | 0 807 979 A2 | 11/1997 |

(Continued)

OTHER PUBLICATIONS

Office Action dated Sep. 16, 2009 from U.S. Appl. No. 12/238,308.

(Continued)

*Primary Examiner* — Ronald W Leja
(74) *Attorney, Agent, or Firm* — Wolf, Greenfield & Sacks, P.C.

(57) ABSTRACT

Semiconductor protection devices, and related methods and systems, especially devices for providing series current limiting. The device typically comprises two regenerative building blocks and/or MOSFETs connected back-to-back in series, where one of the MOSFETs/Regenerative Building Blocks has an extra voltage probe electrode that provides a regenerative signal with self-limited voltage to the other via coupling to its gate electrode.

55 Claims, 10 Drawing Sheets

(56) References Cited

U.S. PATENT DOCUMENTS

| | | | |
|---|---|---|---|
| 4,599,576 A | 7/1986 | Yoshida et al. | |
| 4,610,730 A | 9/1986 | Harrington et al. | |
| 4,630,084 A | 12/1986 | Tihanyi | |
| 4,722,856 A | 2/1988 | Albrecht et al. | |
| 4,783,348 A | 11/1988 | Albrecht et al. | |
| 4,843,441 A | 6/1989 | Willard | |
| 4,903,189 A | 2/1990 | Ngo et al. | |
| 4,955,069 A | 9/1990 | Ionescu | |
| 4,962,411 A | 10/1990 | Tokura et al. | |
| 4,967,243 A | 10/1990 | Baliga et al. | |
| 4,969,028 A | 11/1990 | Baliga | |
| 4,980,741 A | 12/1990 | Temple | |
| 4,982,260 A | 1/1991 | Chang et al. | |
| 4,996,581 A | 2/1991 | Hamasaki | |
| 5,019,530 A | 5/1991 | Kleinsasser et al. | |
| 5,021,861 A | 6/1991 | Baliga | |
| 5,070,377 A | 12/1991 | Harada | |
| 5,111,253 A | 5/1992 | Korman et al. | |
| 5,304,831 A | 4/1994 | Yilmaz et al. | |
| 5,381,025 A | 1/1995 | Zommer | |
| 5,387,805 A | 2/1995 | Metzler et al. | |
| 5,396,085 A | 3/1995 | Baliga | |
| 5,410,171 A | 4/1995 | Tsuzuki et al. | |
| 5,416,354 A | 5/1995 | Blackstone | |
| 5,430,315 A | 7/1995 | Rumennik | |
| 5,446,295 A | 8/1995 | Whitney | |
| 5,532,502 A | 7/1996 | Seki | |
| 5,545,573 A | 8/1996 | Narazaki et al. | |
| 5,554,880 A | 9/1996 | Metzler et al. | |
| 5,559,355 A | 9/1996 | Yamazaki et al. | |
| 5,621,234 A | 4/1997 | Kato | |
| 5,629,536 A | 5/1997 | Heminger et al. | |
| 5,643,809 A | 7/1997 | Lien | |
| 5,719,411 A | 2/1998 | Ajit | |
| 5,742,463 A | 4/1998 | Harris | |
| 5,744,994 A | 4/1998 | Williams | |
| 5,747,841 A | 5/1998 | Ludikhuize | |
| 5,751,025 A | 5/1998 | Heminger et al. | |
| 5,818,084 A | 10/1998 | Williams et al. | |
| 5,825,079 A | 10/1998 | Metzler et al. | |
| 5,869,380 A | 2/1999 | Chang | |
| 5,877,515 A | 3/1999 | Ajit | |
| 5,886,383 A | 3/1999 | Kinzer | |
| 5,898,982 A | 5/1999 | Metzler et al. | |
| 5,929,690 A | 7/1999 | Williams | |
| 5,932,922 A | 8/1999 | Metzler et al. | |
| 5,956,582 A | 9/1999 | Ayela et al. | |
| 6,034,385 A | 3/2000 | Stephani et al. | |
| 6,048,788 A | 4/2000 | Huang et al. | |
| 6,051,850 A | 4/2000 | Park | |
| 6,078,074 A | 6/2000 | Takebuchi et al. | |
| 6,097,046 A | 8/2000 | Plumton | |
| 6,100,145 A | 8/2000 | Kepler et al. | |
| 6,169,300 B1 | 1/2001 | Fragapane | |
| 6,172,398 B1 | 1/2001 | Hshieh | |
| 6,186,408 B1 | 2/2001 | Rodov et al. | |
| 6,225,280 B1 | 5/2001 | Dokter et al. | |
| 6,235,601 B1 | 5/2001 | Kim | |
| 6,242,324 B1 | 6/2001 | Kub et al. | |
| 6,258,634 B1 | 7/2001 | Wang et al. | |
| 6,268,758 B1 | 7/2001 | Limmer et al. | |
| 6,281,547 B1 | 8/2001 | So et al. | |
| 6,313,001 B1 | 11/2001 | Johansson et al. | |
| 6,323,091 B1 | 11/2001 | Lee et al. | |
| 6,331,455 B1 | 12/2001 | Rodov et al. | |
| 6,362,036 B1 | 3/2002 | Chiozzi et al. | |
| 6,373,097 B1 | 4/2002 | Werner | |
| 6,384,456 B1 | 5/2002 | Tihanyi | |
| 6,392,859 B1 * | 5/2002 | Ohshima | 361/100 |
| 6,399,996 B1 | 6/2002 | Chang et al. | |
| 6,404,033 B1 | 6/2002 | Chang et al. | |
| 6,420,225 B1 | 7/2002 | Chang et al. | |
| 6,426,541 B2 | 7/2002 | Chang et al. | |
| 6,448,160 B1 | 9/2002 | Chang et al. | |
| 6,459,108 B1 | 10/2002 | Bartsch et al. | |
| 6,476,442 B1 | 11/2002 | Williams et al. | |
| 6,498,367 B1 | 12/2002 | Chang et al. | |
| 6,515,330 B1 | 2/2003 | Hurtz et al. | |
| 6,537,860 B2 | 3/2003 | Akiyama et al. | |
| 6,624,030 B2 | 9/2003 | Chang et al. | |
| 6,630,698 B1 | 10/2003 | Deboy et al. | |
| 6,653,740 B2 | 11/2003 | Kinzer et al. | |
| 6,724,039 B1 | 4/2004 | Blanchard | |
| 6,743,703 B2 | 6/2004 | Rodov et al. | |
| 6,765,264 B1 | 7/2004 | Chang et al. | |
| 6,784,489 B1 | 8/2004 | Menegoli | |
| 6,828,605 B2 | 12/2004 | Eisele et al. | |
| 6,853,036 B1 | 2/2005 | Rodov et al. | |
| 6,897,682 B2 | 5/2005 | Nadd | |
| 6,956,266 B1 | 10/2005 | Voldman et al. | |
| 6,967,374 B1 | 11/2005 | Saito et al. | |
| 6,979,861 B2 | 12/2005 | Rodov et al. | |
| 6,992,353 B1 | 1/2006 | Wu | |
| 7,009,253 B2 | 3/2006 | Rodov et al. | |
| 7,087,981 B2 | 8/2006 | Kapels et al. | |
| 7,095,113 B2 | 8/2006 | Xiaochun et al. | |
| 7,135,740 B2 * | 11/2006 | Chang | 257/341 |
| 7,220,319 B2 * | 5/2007 | Sago et al. | 118/725 |
| 7,250,668 B2 | 7/2007 | Chang et al. | |
| 7,264,999 B2 | 9/2007 | Xiaochun et al. | |
| 7,342,389 B1 | 3/2008 | Wu et al. | |
| RE40,222 E | 4/2008 | Fragapane | |
| 7,476,932 B2 * | 1/2009 | Zhang et al. | 257/330 |
| 7,781,826 B2 | 8/2010 | Mallikararjunaswamy et al. | |
| 7,893,489 B2 | 2/2011 | Kobayashi | |
| 8,148,748 B2 * | 4/2012 | Ankoudinov et al. | 257/124 |
| 2001/0045635 A1 * | 11/2001 | Kinzer et al. | 257/685 |
| 2002/0019115 A1 | 2/2002 | Rodov et al. | |
| 2002/0024375 A1 | 2/2002 | Asano et al. | |
| 2002/0177324 A1 | 11/2002 | Metzler | |
| 2002/0179968 A1 * | 12/2002 | Pfirsch | 257/341 |
| 2003/0025152 A1 | 2/2003 | Werner et al. | |
| 2003/0146474 A1 | 8/2003 | Ker et al. | |
| 2003/0207538 A1 | 11/2003 | Hshieh et al. | |
| 2003/0222290 A1 | 12/2003 | Rodov et al. | |
| 2004/0041619 A1 | 3/2004 | Nadd | |
| 2005/0029585 A1 | 2/2005 | He et al. | |
| 2005/0116313 A1 | 6/2005 | Lee et al. | |
| 2005/0152080 A1 | 7/2005 | Harris et al. | |
| 2005/0189626 A1 | 9/2005 | Xiaochun et al. | |
| 2005/0189658 A1 | 9/2005 | Xiaochun et al. | |
| 2005/0200384 A1 | 9/2005 | Nadd | |
| 2005/0200394 A1 | 9/2005 | Underwood et al. | |
| 2005/0231355 A1 | 10/2005 | Hair, III et al. | |
| 2005/0243496 A1 | 11/2005 | Harris | |
| 2006/0071295 A1 * | 4/2006 | Chang | 257/510 |
| 2006/0097323 A1 | 5/2006 | Rodov et al. | |
| 2006/0098363 A1 | 5/2006 | Hebert et al. | |
| 2006/0098364 A1 | 5/2006 | Harris et al. | |
| 2006/0098373 A1 | 5/2006 | Hebert et al. | |
| 2006/0145260 A1 | 7/2006 | Kim | |
| 2006/0158812 A1 | 7/2006 | Harris | |
| 2006/0158816 A1 | 7/2006 | Harris et al. | |
| 2006/0176638 A1 | 8/2006 | Coates | |
| 2006/0244060 A1 | 11/2006 | Kapels et al. | |
| 2006/0250736 A1 | 11/2006 | Harris | |
| 2006/0285264 A1 | 12/2006 | Harris | |
| 2007/0235752 A1 | 10/2007 | Rodov et al. | |
| 2007/0246794 A1 | 10/2007 | Chang et al. | |
| 2008/0017930 A1 | 1/2008 | Kim et al. | |
| 2008/0079035 A1 | 4/2008 | Bobde | |
| 2008/0079065 A1 * | 4/2008 | Zhang et al. | 257/330 |
| 2008/0137249 A1 | 6/2008 | Harris | |
| 2008/0192394 A1 | 8/2008 | Harris | |
| 2008/0265975 A1 | 10/2008 | Takasu et al. | |
| 2008/0284383 A1 * | 11/2008 | Aas et al. | 320/164 |
| 2009/0026492 A1 | 1/2009 | Chatty et al. | |
| 2010/0271851 A1 * | 10/2010 | Ankoudinov et al. | 363/126 |

FOREIGN PATENT DOCUMENTS

| | | |
|---|---|---|
| JP | 04-343260 A | 11/1992 |
| JP | 05082534 A | 4/1993 |
| JP | 05175206 A | 7/1993 |

(56) References Cited

FOREIGN PATENT DOCUMENTS

| JP | 06061250 A | 3/1994 |
|---|---|---|
| JP | 06112149 A | 4/1994 |
| JP | 08-017933 A | 1/1996 |

OTHER PUBLICATIONS

Office Action dated Aug. 9, 2010 from U.S. Appl. No. 12/359,094.
Office Action/Restriction Requirement dated Sep. 16, 2009 from U.S. Appl. No. 12/359,094.
Office Action dated Sep. 21, 2009 from U.S. Appl. No. 12/431,580.
Final Office Action dated Dec. 8, 2010 from U.S. Appl. No. 12/431,580.
Extended European Search Report dated Jan. 5, 2011 from European Application No. 09813383.8.
International Search Report dated Mar. 10, 2009 from International Application No. PCT/US2009/031885.
Written Opinion of the International Searching Authority dated Mar. 10, 2009 from International Application No. PCT/US2009/031885.
International Search Report dated Dec. 4, 2008 from International Application No. PCT/US2008/077747.
International Search Report dated Aug. 16, 2010 from International Application PCT/US2010/020284.
International Search Report dated Dec. 20, 2010 from International Application PCT/US2010/033451.
International Search Report dated Jun. 19, 2009 from International Application PCT/US2009/041996.
Written Opinion of the International Searching Authority dated Jun. 19, 2009 from International Application PCT/US2009/041996.
Office Action from U.S. Appl. No. 12/683,425 dated Dec. 27, 2011.
Ankudinov, A. et al, "High injection regime of the super barrier(TM) rectifier," Solid-State Electronics, vol. 51, No. 5, pp. 714-718.
Ankudinov, A. et al. "Electrostatic force microscopy study of the electric field distribution in semiconductor laser diodes under applied biases," 9th Int. Symp. "Nanostructures: Physics and Technology," St. Petersburg, Russia, Jun. 18-22, 2001, pp. 198-201.
Ankudinov, A. et al., "Fine Structure of the Inner Electric Field in Semiconductor Laser Diodes Studied by EFM," Phys. Low-Dim. Struct., 3/4, 2001, pp. 9-16.
Ankudinov, A. et al., "Study of high power GaAs-based laser diodes operation and failure by cross-sectional electrostatic force microscopy," 10th Int. Symp. Nanostructures: Physics and Technology, Jun. 17-21, 2002, St. Petersburg, Russia, pp. 143-145.
Bashirov, A.M. et al., "Switching of thyristors using the dU/dt effect," Radiotekhnika i Elektronika, vol. 14, No. 2, USSR, Feb. 1969, pp. 374-375.
Bixby, B. et al., "Application Considerations for Very High Speed Fast Recovery Power Diodes," IEEE, IAS 1977 Annual, pp. 1023-1027.
Chelnokov, E. et al, "Effect of moving charge carriers in a collector junction of p-n-p-n structure on the switching on process," Radiotekhnika I Elektronika, v 16, USSR, 1971, pp. 1039-1046.
Christiansen, B. "Synchronous Rectification," PCIM, Aug. 1998, pp. 14-21.
Hikin, B. et al., "Reverse Recovery Process with Non-Uniform Lifetime Distribution in the Base of a Diode," IEEE, IAS 1977 Annual, pp. 644-647.
Huth, G., "Study of the Spatial Characteristics of the Breakdown Process in Silicon PN-Junctions," Proc. of the 2nd Int. Conf. on Transmutation Doping in Semiconductors, University of Missouri, Columbia, MO, Apr. 23-26, 1978, pp. 91-108.
Kuz'min, V.A. et al., "P-N-P-N-Structures Turning on at High-Voltage and High-Current Density, " Radiotekhnika I Elektronika, vol. 20, No. 7, USSR, 1975, pp. 1457-1465.
Kuz'min, V.A. et al., "The turn-on process of p-n-p-n structures at high voltages and a high current density, " Radiotekhnika i Elektronika, vol. 20, No. 8, USSR, Aug. 1975, pp. 1710-1714.
Kuz'min, V.A. et al., "Turn-on of a p-n-p-n structure at a high current density," Radiotekhnika i Elektronika, vol. 18, No. 1, USSR, Jan. 1973, pp. 158-166.
Lorenz, L. et al., "Improved MOSFET, An Important Milestone Toward a New Power MOSFET Generation," PCIM, Sep. 1993, pp. 14-21.
Melnik, Y. et al., "HVPE GaN and AlGaN "Substrates" for Homoepitaxy," Materials Science Forum vols. 164-268, 1998, pp. 1121-1124.
Molibog, N. P. et al., "The effect of mobile charge carriers in the collector junction of a p-n-p-n structure on the turn-on process," Radiotekhnika i Elektronika, vol. 16, No. 6, USSR, Jun. 1971, pp. 1039-1046.
Pavlik, V.Y. et al., "The I-V characteristic of a p-n-p-n structure in the 'on' state for high residual voltages," Radiotekhnika i Elektronika, vol. 18, No. 7, USSR, Jul. 1974, pp. 1468-1475.
Rodov, V. et al, "Super barrier rectifier—a new generation of power diode," IEEE Transactions on Industry Applications, vol. 44, No. 1, pp. 234-237.
Rodov, V.I. et al., "Calculation of the Current-Voltage characteristic of an unsaturated p-n-p-n structure," Radiotekhnika i Elektronika, vol. 19, No. 6, USSR, Jun. 1974, pp. 1325-1326.
Rodov, V.I., "Non-one-dimensional processes in p-n-p-n structures," Poluprovodnikovye Pribory i ikh Primenenie, No. 28, USSR, 1974, pp. 3-22.
Vemulapati, U. et al., "The Concept of a Regenerative Diode", IEEE, 2007, pp. 193-196.
Office Action dated Mar. 3, 2011 from U.S. Appl. No. 12/359,094.
Office Action dated Mar. 3, 2011 from U.S. Appl. No. 12/238,308.
Office Action from U.S. Appl. No. 12/431,580, dated May 9, 2012.
Office Action from U.S. Appl. No. 12/683,425, dated Jun. 20, 2012.
Office Action from U.S. Appl. No. 13/398,591 dated Jul. 26, 2012.
Office Action from U.S. Appl. No. 12/359,094 dated Aug. 15, 2012.
Extended European Search Report from related European Patent Application No. 09739614,7, dated Nov. 12, 2012.
Notice of Allowance from U.S. Appl. No. 12/431,580 dated Aug. 2, 2013.
Office Action from U.S. Appl. No. 12/431,580 dated Dec. 21, 2012.
Notice of Allowance from U.S. Appl. No. 12/359,094 dated Dec. 14, 2012.

* cited by examiner

SERIES CURRENT LIMITER DEVICE

CROSS REFERENCE TO OTHER APPLICATIONS

The present application claims priority from U.S. Provisional Application 61/174,865 filed 1 May 2009, which is hereby incorporated by reference.

The present application also claims priority from U.S. patent application Ser. No. 12/683,425 filed 6 Jan. 2010, and therethrough from U.S. patent application Ser. No. 12/359,094 filed 23 Jan. 2009, U.S. patent application Ser. No. 12/238,308 filed 25 Sep. 2008, U.S. Provisional Patent Application 61/022,968 filed 23 Jan. 2008, U.S Provisional Patent Application 60/975,467 filed 26 Sep. 2007 and U.S. Provisional Patent Application 61/142,647 filed 6 Jan. 2009, all of which are hereby incorporated by reference.

The present application also claims priority from U.S. patent application Ser. No. 12/431,580 filed 28 Apr. 2009, and therethrough from U.S. patent application Ser. No. 12/359,094 filed 23 Jan. 2009, U.S. patent application Ser. No. 12/238,308 filed 25 Sep. 2008, U.S. Provisional Patent Application 61/022,968 filed 23 Jan. 2008, U.S. Provisional Patent Application 60/975,467 filed 26 Sep. 2007, and U.S. Provisional Patent Application 61/048,336 filed 28 Apr. 2008. All of these applications are hereby incorporated by reference.

The present application also claims priority from U.S. patent application Ser. No. 12/359,094 filed 23 Jan. 2009, and therethrough from U.S. patent application 12/238,308 filed 25 Sep. 2008, U.S. Provisional Patent Application 60/975,467 filed 26 Sep. 2007, and U.S. Provisional Patent Application 61/022,968 filed 23 Jan. 2008. All of these applications are hereby incorporated by reference.

The present application also claims priority from U.S. patent application Ser. No. 12/238,308 filed 25 Sep. 2008, and therethrough from U.S. Provisional Patent Application 60/975,467 filed 26 Sep. 2007, and also (through Ser. No. 12/238,308) from U.S. Provisional Patent Application 61/048,336 filed 28 Apr. 2008, and from U.S. Provisional Patent Application 61/022,968 filed 23 Jan. 2008. All of these applications are hereby incorporated by reference.

BACKGROUND

The present inventions relate generally to semiconductor protection devices, and more specifically to a device for providing series current limiting of sensitive electronics against large currents and voltages during various surge events.

Protection against surge events is an important part of circuit design. The surge events can take the form of either surge currents or voltages and can be caused by lightning, short circuits and various faults in the power systems. The primary protection from these surges is accomplished by circuit breakers, fuses, shunts, and gas discharge tubes (GDT). All of these protection devices have limitations, and electronic circuits still can be damaged by voltages typically in the range of tens to hundreds of volts and currents below one ampere. Thus, a secondary protection is typically accomplished by thyristors. However, the use of thyristors requires a careful design of the coordination between primary and secondary protections.

Even with careful surge coordination, prior art surge protection designs have particular weakness and generally lack reliability. There has been a long-felt need for a simple secondary inline protection device. The primary protection device lets through much smaller amounts of energy, with predictable current and voltage levels. This energy can be blocked by a series secondary protector (in line with the transmission line). Ideally this device should add no more than a small series resistance during regular operation of the circuit.

During a current surge event, the device should block the current above a desired level and be able to withstand the secondary surge voltage. FIG. 1 shows the schematic I-V curve, including all quadrants, for the ideal secondary surge protector operation. Previously in the prior art, transient blocking units were proposed to achieve characteristic performance shown in FIG. 1. A variety of such transient blocking units have been published as U.S. published applications 20080192394, 20060285264, 20060176638, 20060098373, 20060098364, and 20060098363, all of which are hereby incorporated by reference.

FIG. 2 shows such a prior art device made from two MOSFETs as shown (G1, D1 and G2, D2 respectively). Notice that, to operate at small voltages, each MOSFET should possess a small threshold voltage, and therefore a small gate oxide thickness at G1 and G2. In practice, in embodiments designed for handling significant voltage, one cannot apply full drain voltage to the low threshold gate, because the thin gate oxide may be damaged and the device may be destroyed. Therefore, additional circuit elements had to be added in order to overcome the above problems.

SUMMARY

The present application discloses new approaches to an electronic device, referred to hereinafter as a series current limiter (SCL) device, which uses a Regenerative building block (RBB), such as disclosed in U.S. patent application Ser. No. 12/359,094 filed Jan. 23, 2009, which is hereby incorporated by reference. The present inventors have realized that the self-bootstrapping diode described in commonly owned U.S. patent application Ser. No. 12/683,425 provides a very good "lambda device" characteristic in its reverse-bias regime, and that the limiting current density of this reverse-bias regime can be easily adjusted. The present inventors have also realized that, by combining two such devices with opposing polarities, a transient blocking device can be achieved which provides bidirectional lambda device characteristics. Many different embodiments are described.

The disclosed innovations, in various embodiments, provide one or more of at least the following advantages. However, not all of these advantages result from every one of the innovations disclosed, and this list of advantages does not limit the various claimed inventions.

Greater robustness and reliability.
Greater operatively across a wider voltage range.
One device can be utilized for current limiting rather than multiple devices as previously required.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The present application discloses new approaches to an electronic device, referred to hereinafter as a series current limiter (SCL) device, which uses a Regenerative building block (RBB), such as disclosed in U.S. patent application Ser. No. 12/359,094 filed Jan. 23, 2009, which is hereby incorporated by reference. The present inventors have realized that the self-bootstrapping diode described in commonly owned U.S. patent application Ser. No. 12/683,425 provides a very good "lambda device" characteristic in its reverse-bias regime, and that the limiting current density can be easily adjusted. The present inventors have also realized that, by combining two such devices with opposing polarities, a transient blocking device can be achieved which provides bidirectional lambda device characteristics. Many different embodiments are described.

Figure 1:
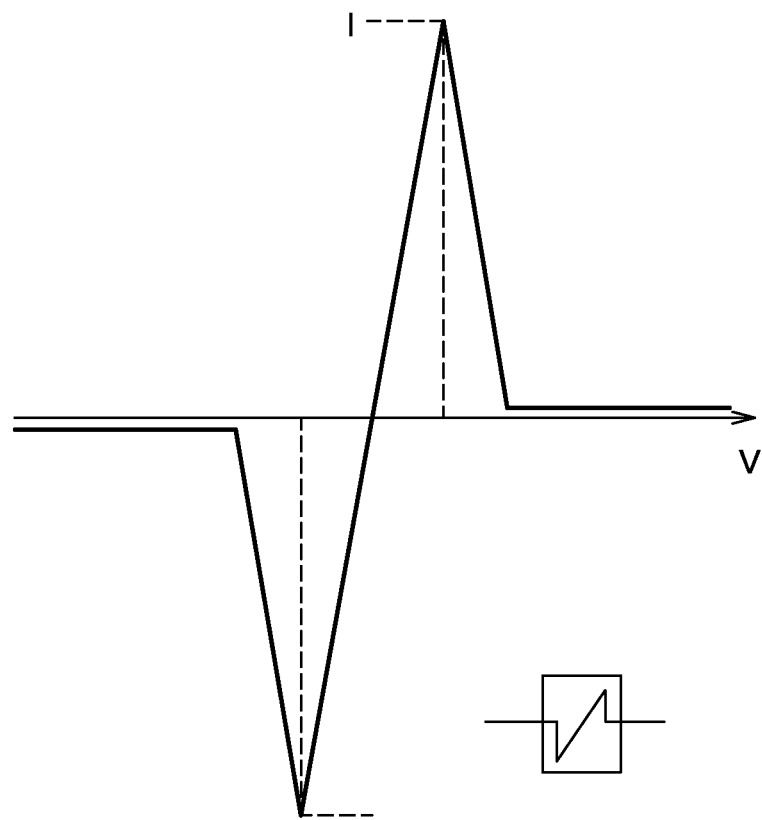
FIG. 1 shows a schematic I-V curve for an ideal secondary surge protector operation.
Figure 2:
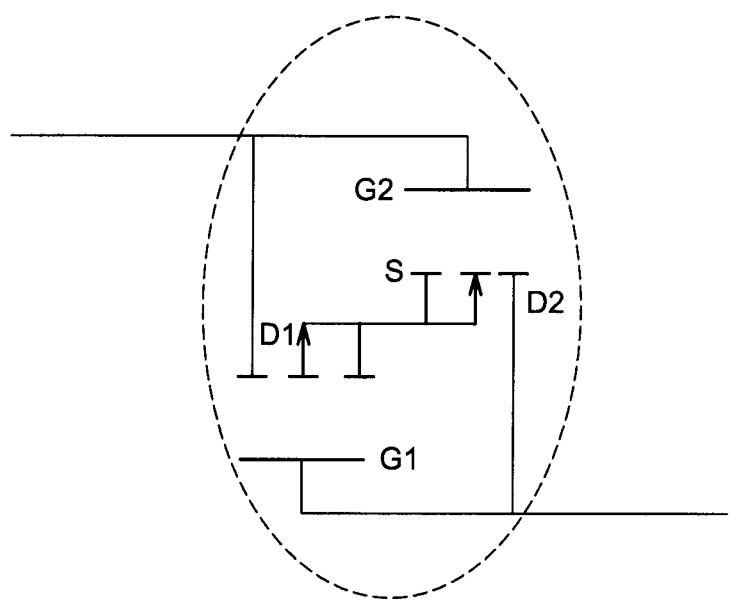
FIG. 2 shows an example of a conventional series current limiting (or transient blocking) device made from two MOSFETs.

In some embodiments, the device uses two external electrodes to achieve a voltage-current characteristic very close to the ideal one shown on FIG. 1. The use of such an Regenerative Building Block avoids the problems of a large gate signal which can occur in the known structure of FIG. 2.

Internally, the Series Current Limiter device can be built as a regenerative combination of a Regenerative Building Block (RBB) together with another Regenerative Building Block or MOSFET: one of a P-type and the other of the N-type (FIG. 3 and FIG. 5) with both channels normally in the conductive ON state. The regenerative configuration produces the effect that both channels stay in the conductive ON state for increasing applied voltage until one of the regenerative signals reaches the threshold voltage. After that occurs, both regenerative couplings turn both channels into blocking OFF state.

Figure 3:
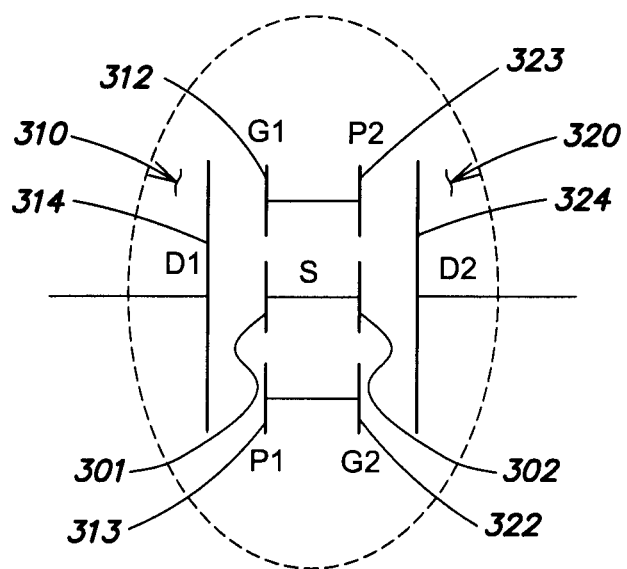
FIG. 3 shows a schematic for a Series Current Limiter made from two Regenerative Building Blocks.
Figure 5:
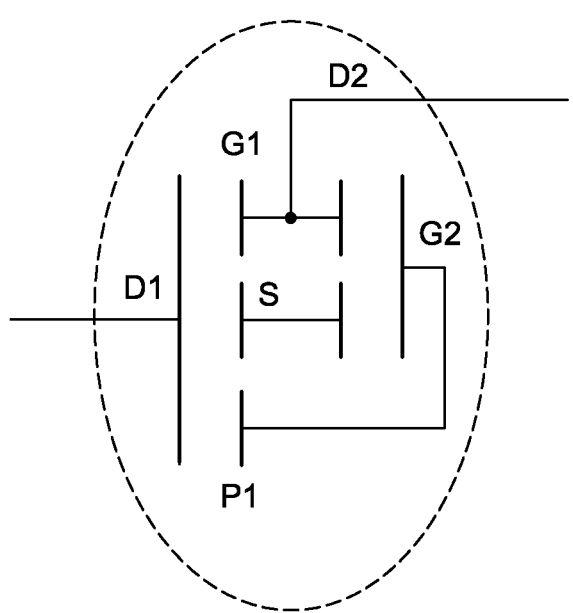
FIG. 5 shows a schematic for a Series Current Limiter made from the combination of a Regenerative Building Block and a MOSFET.

Individually, the devices shown in FIGS. 3 and 5 provide only unidirectional protection, since for the forward bias they act as small resistors. Two such devices connected back-to-back in series will provide bidirectional protection as shown for the ideal device of FIG. 1. Since the series current limiter device has only two contacts and is used for both incoming lines, the complexity of coordination between primary and secondary surge protection is avoided. The use of a voltage probe electrode automatically restricts the maximum voltage on the gate, providing gate protection.

In order to achieve a high limiting current for the transient blocking unit, two kinds of modifications are preferably made to the diode of Ser. No. 12/683,425. Geometric modifications can be made to reduce the voltage change seen at the probe contact when the current through the device increases; for example, in the device structure of FIG. 4, the lateral separation between the prone and source regions can be increased.

In addition, the device parameters can be adjusted so that it is more difficult to switch the active device to its OFF state. For example, in one sample embodiment the "bootstrap" diode of Ser. No. 12/683,425 was modified by doubling the gate oxide thickness (from 50 Å to 100 Å), and by reducing the channel doping by a factor of 6 (changing from an implant of $6 \times 10^{12}$ cm$^{-2}$ boron at 30 keV to an implant of $1 \times 10^{12}$ cm$^{-2}$ boron at 30 keV). Of course these specific numbers are merely examples of how a particular process was modified, but they do help to show an example of what sort of changes can be useful to optimize the device for use as a transient blocking unit. In general, optimization of the bootstrap diode structure for use as a transient blocking unit should make the diode leaky. The maximum peak current through a diode optimized for transient blocking is preferably several orders of magnitudes larger than that of the same structure optimized for fast reaction and low forward voltage drop.

The present application discloses a new series current limiter (SCL) device, which (in one example) can be viewed in simplified form, as a regenerative combination of two MOSFETs, where one of the MOSFETs has an extra voltage probe electrode that provides a regenerative signal with self-limited voltage that cannot destroy the other gate.

A generalized schematic representation of the internal configuration of one embodiment of Series Current Limiter, comprising a combination of a specially-constructed N-type Regenerative Building Block 310 and a specially-constructed P-type Regenerative Building Block 320, is shown in FIG. 3. The source electrodes S of the two Regenerative Building Blocks (301 and 302) are shorted together. The gate electrode of each Regenerative Building Block, indicated as G1 312 and G2 322, is controlled by a regenerative signal from the probe contact P2 323 (and P1 313) of the other Regenerative Building Block. The drain electrode D2 324 of the N-type Regenerative Building Block G2 322 serves as a cathode K for the Series Current Limiter, and the drain electrode D1 314 of the P-type Regenerative Building Block as an anode A. The cathode and anode are the only external electrodes.

For the forward bias, both P and N channels are open and the device has small resistance. The probe electrode of the Regenerative Building Block provides a low voltage well defined regenerative signal, which is well-suited for the gate electrode of the adjacent device. For the reverse bias, the regenerative voltages above the threshold will close both of the channels. Thus, in terms of black box operation, the device operates as a unidirectional protection device, and can be represented by the symbol shown in FIG. 1, which reflects the ideal protector characteristic.

In one embodiment, the thickness of the gate oxide and the doping in the channel region are carefully managed to optimize device performance. In addition, N++doping in the probe opening is preferred over P++doping in at least some embodiments.

One possible way to manufacture the Regenerative Building Block is described in U.S. patent application Ser. No. 12/359,094 filed Jan. 23, 2009, which is hereby incorporated by reference.

Figure 4:
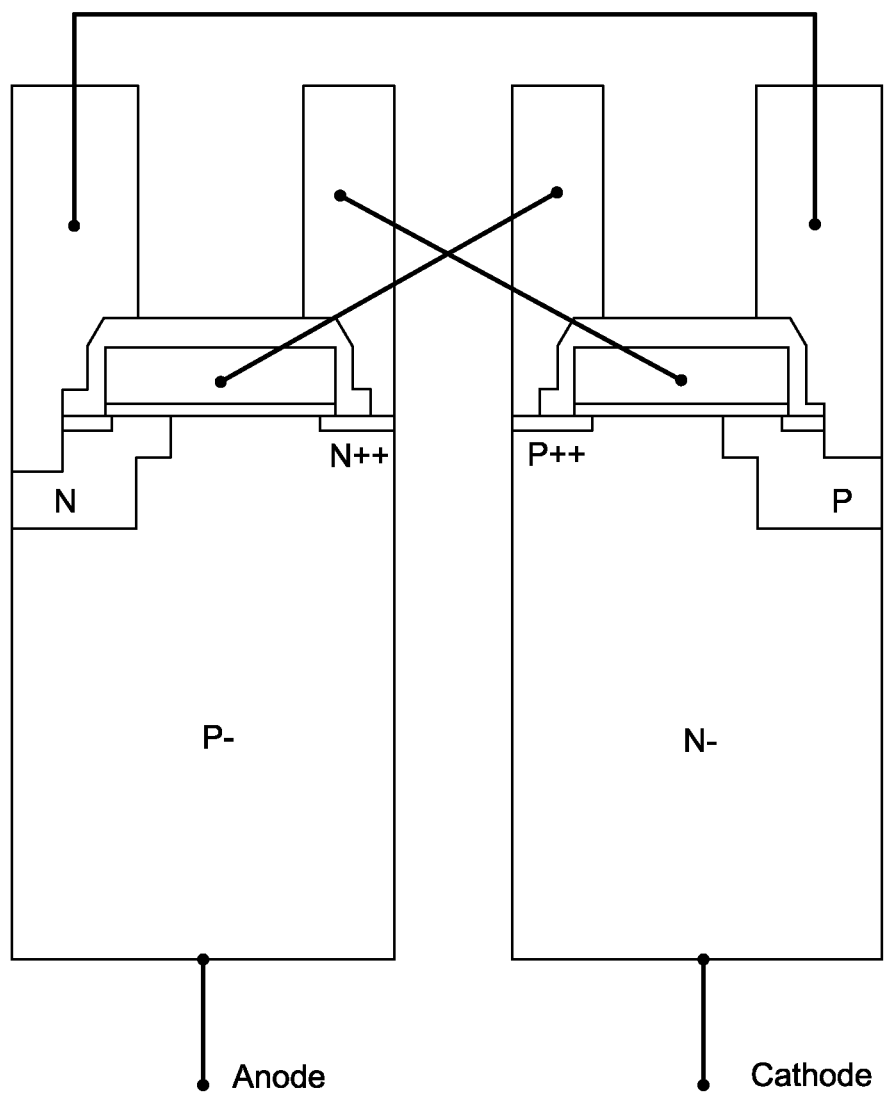
FIG. 4 shows a Series Current Limiter made from the combination of a P-channel and a N-channel Regenerative Building Block. In this example, the probe electrode of either RBB is connected to the gate electrode of the other, and this configuration provides automatic switching between ON and OFF states.

FIG. 4 shows the configuration for one side of a Series Current Limiter, using the combination of a P-channel and an N-channel Regenerative Building Block. Using modifications as described above, the maximum current density of the reverse-biased device can be made usefully large. By using a series combination of two such devices back-to-back, a bidirectional Transient Blocking Unit can be achieved.

In an alternative arrangement, one side of a Series Current Limiter can be also made from a combination of a Regenerative Building Block and a MOSFET.

Figure 6:
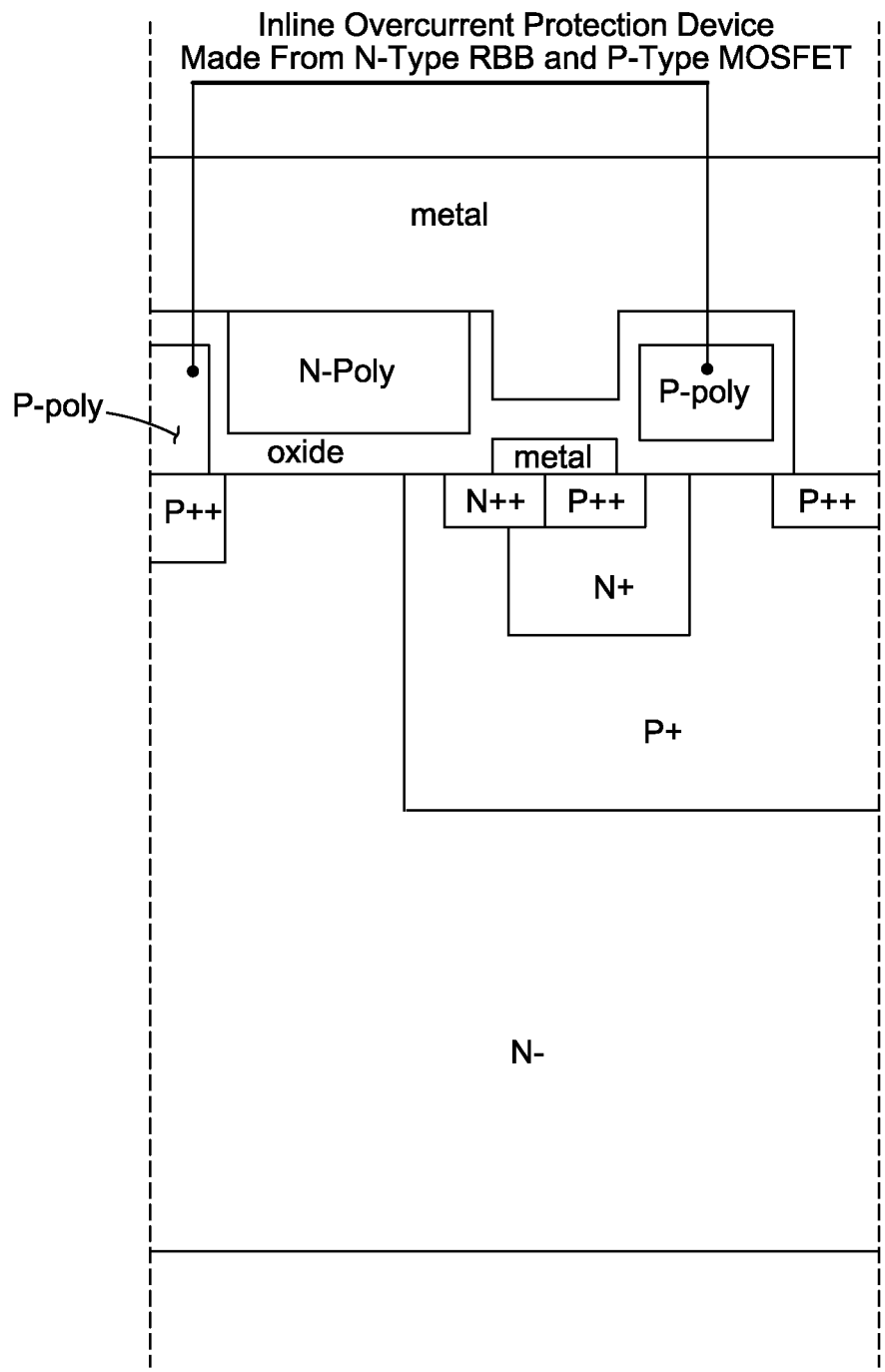
FIG. 6 is a structural representation of a Series Current Limiter made from the combination of a N-type Regenerative Building Block and a P-type MOSFET.

FIG. 5 shows an embodiment of such a device in schematic form, while FIG. 6 illustrates the structure of such an embodiment of a Series Current Limiter in accordance with a sample innovative embodiment. Using modifications as described above, the maximum current density of the reverse-biased device can be made usefully large. By using a series combination of two such devices back-to-back, a bidirectional Transient Blocking Unit can be achieved.

Figure 7:
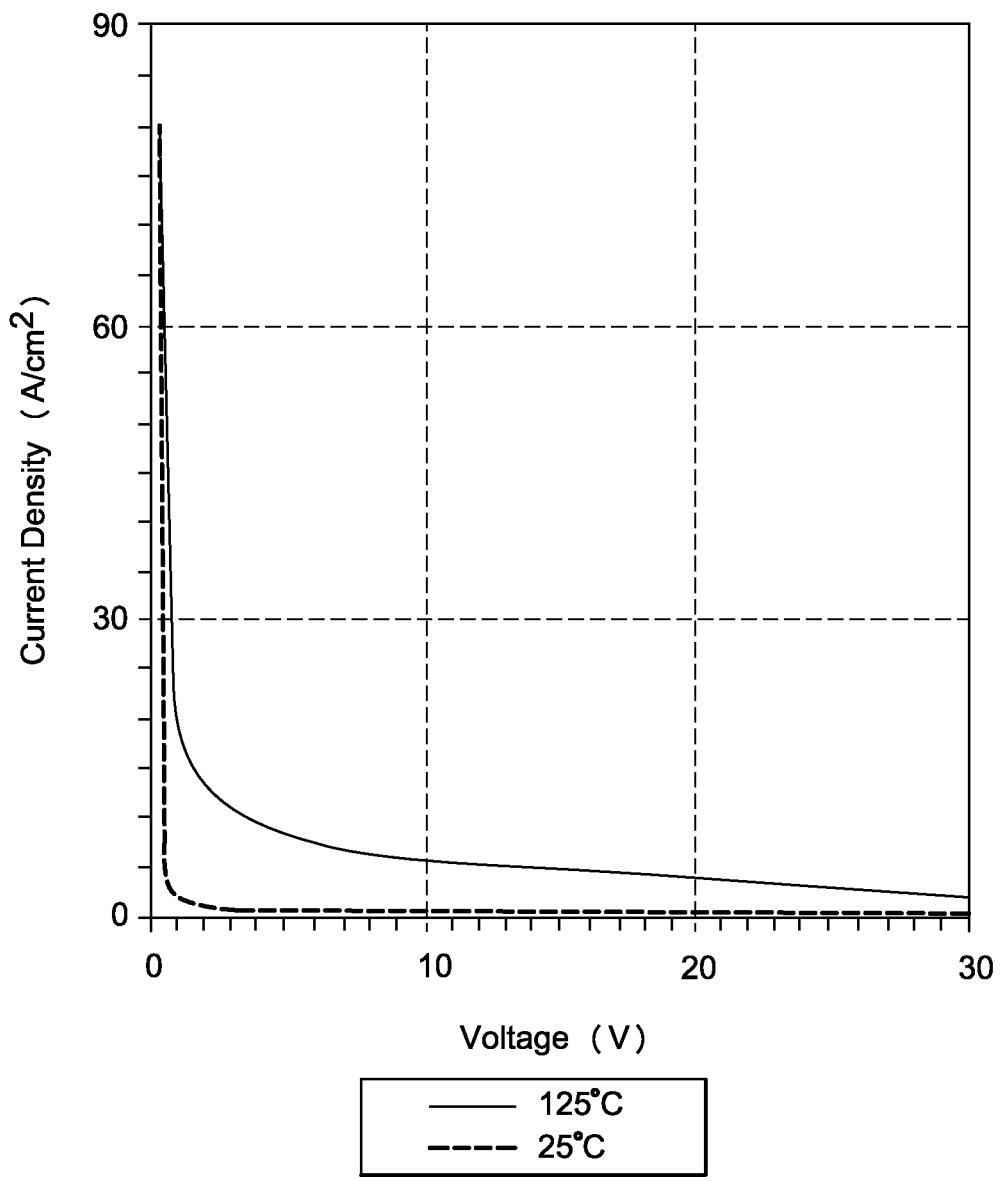
FIG. 7 is a graph showing the reverse bias with forward voltage drop versus applied current for a Series Current Limiter device, both at 125 C (the upper line) and at 25 C (the lower line).
Figure 8A:
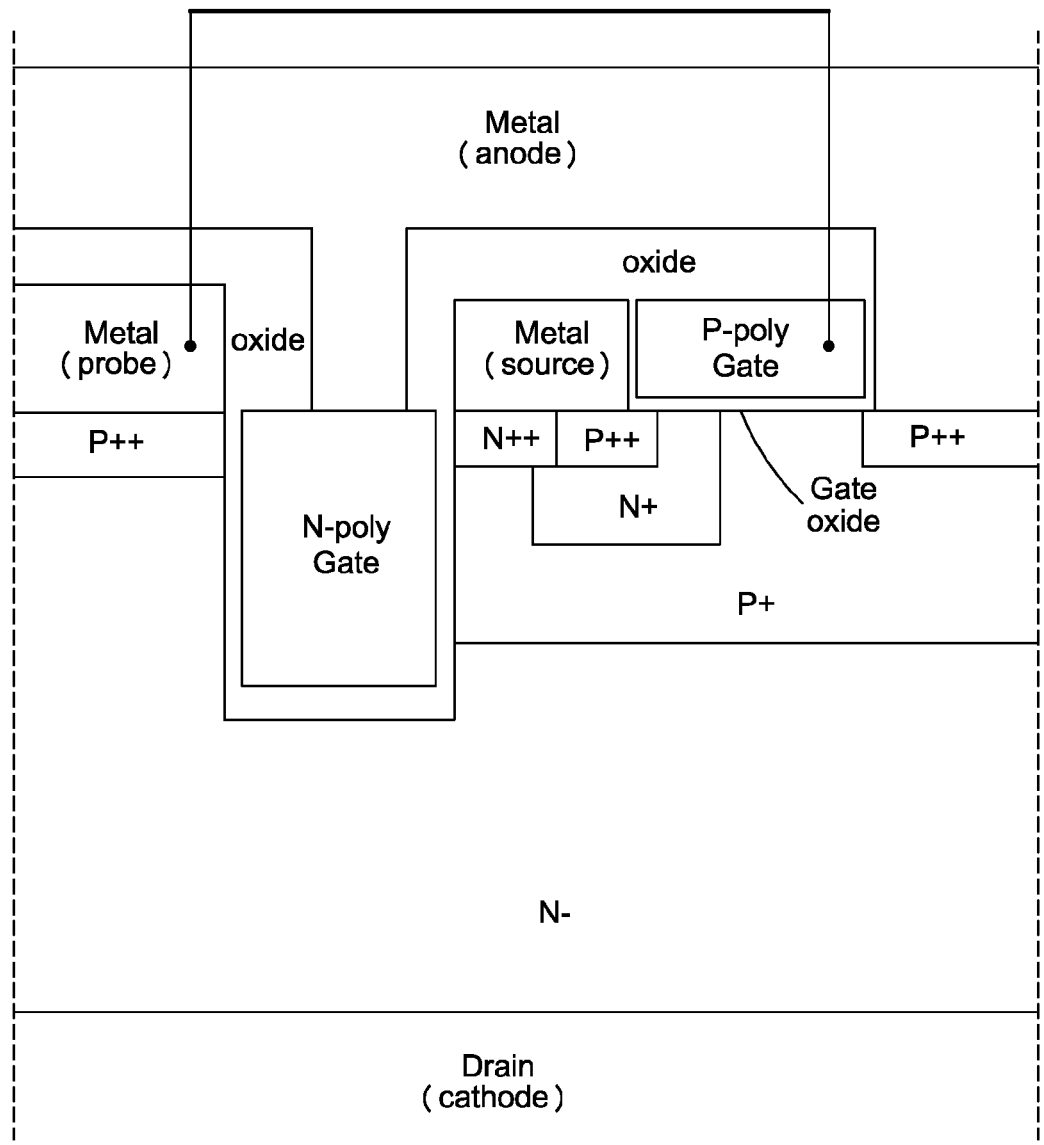
FIGS. 8A, 8B, 8C, and 8D show four different UMOS realizations of Series Current Limiter devices.
Figure 8B:
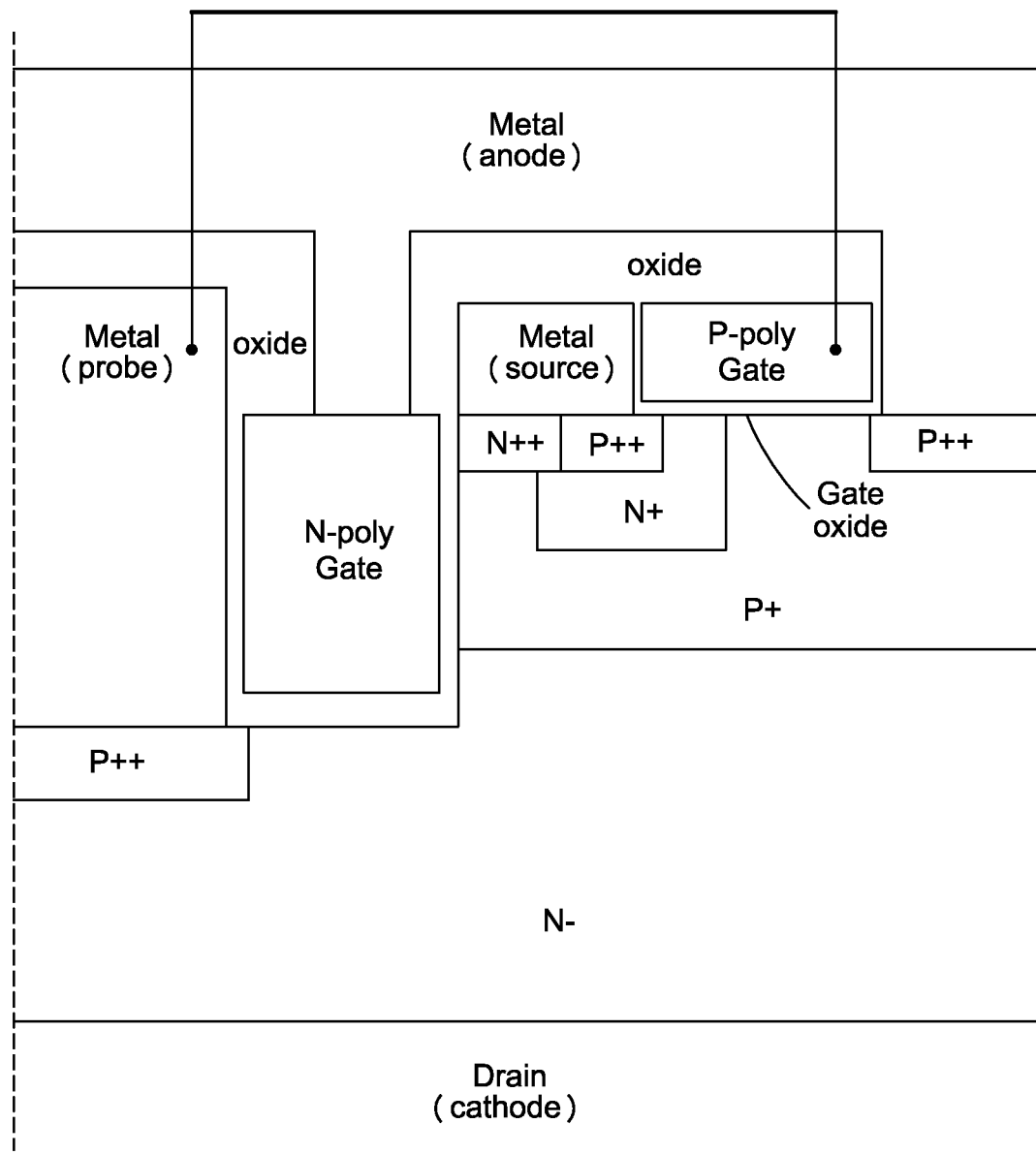
Figure 8C:
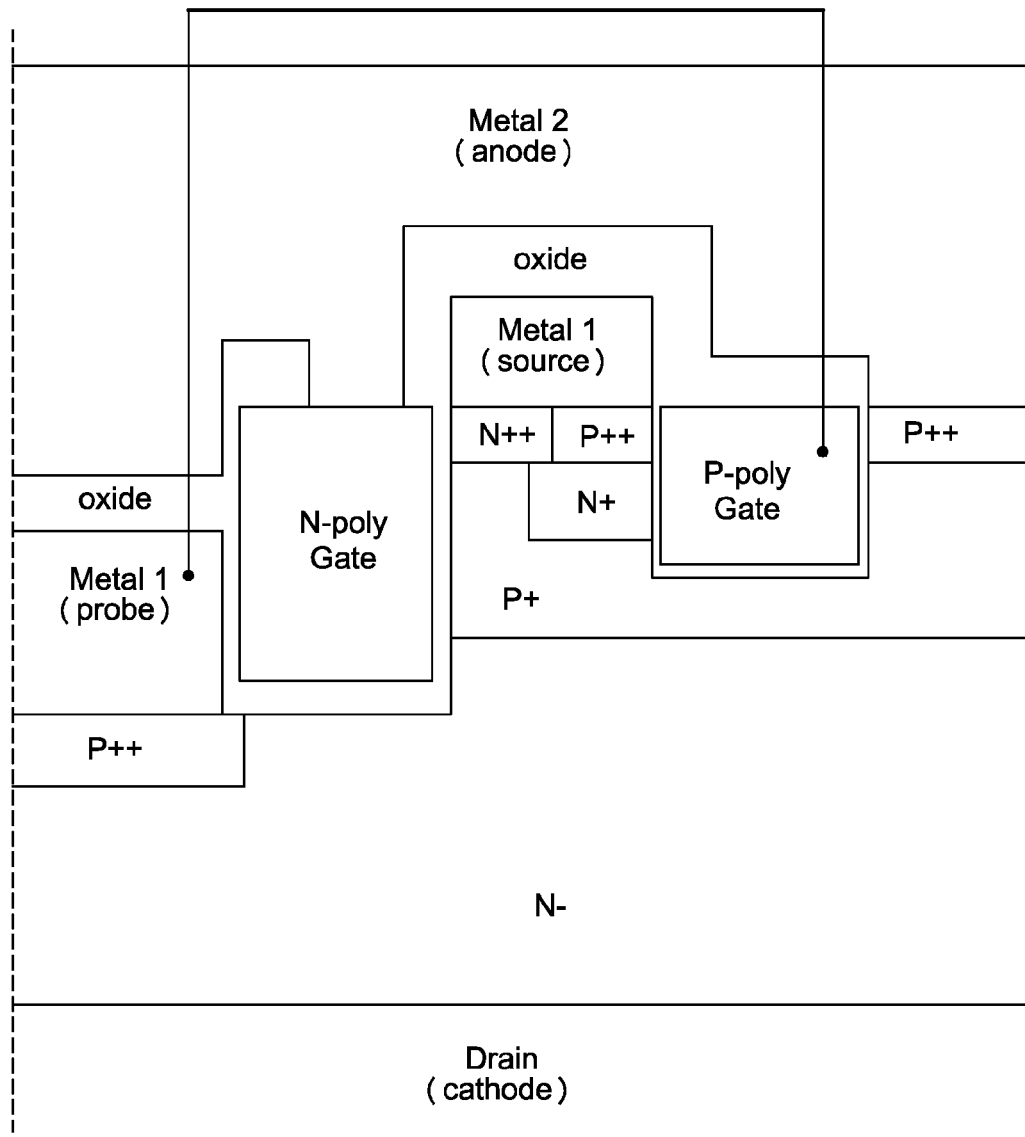
Figure 8D:
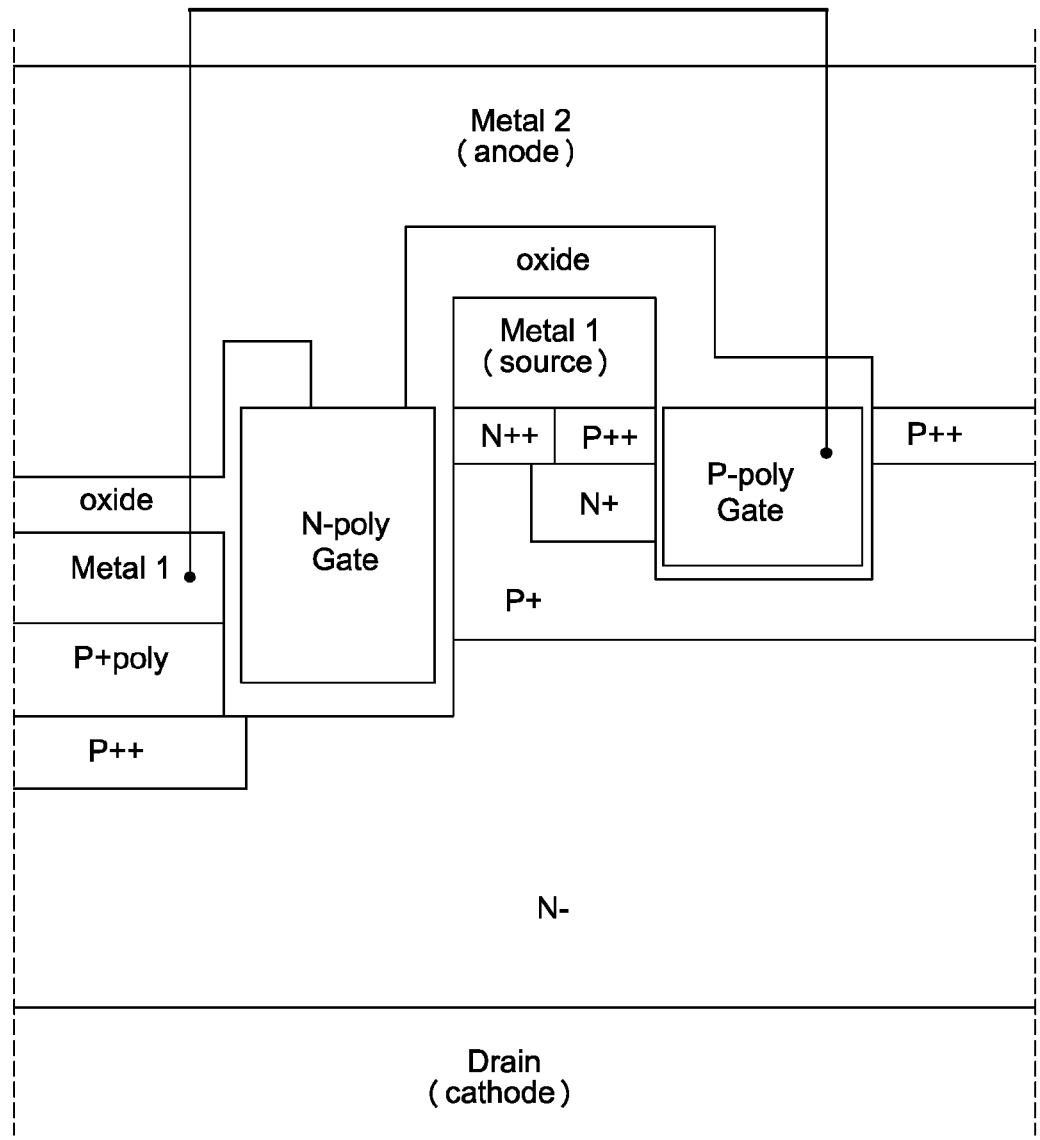

Using a design like that shown in FIG. 6, the IV curve for reverse bias is shown in FIG. 7. As will be appreciated by those skilled in the art, the Series Current Limiter performance in accordance with the inventions resembles the ideal case. The peak current density at 0.2V is 30 A/cm$^2$, which is appropriate to make the protection device. For example, to protect for surge currents above 0.3 A the area is 0.01 cm$^2$ and series resistance is only 0.67 ohm.

It can therefore be appreciated that the performance characteristics of an Series Current Limiter device, in accordance with the inventions, approach those of an ideal secondary surge protector and the device of the present inventions does not need the coordination between primary and secondary protection typically required of the prior art devices.

FIGS. 8A-8D illustrate further alternatives of one side of a Series Current Limiter device, using UMOS technology for fabricating the Series Current Limiter device. Using modifications as described above, the reverse-biased device characteristics can be optimized for a Transient Blocking Unit. By using a series combination of two such devices back-to-back, a bidirectional Transient Blocking Unit can be achieved.

The foregoing has described methods and systems for Series Current Limiter circuits that are given for illustration and not for limitation and uses. Thus the inventions are limited only by the appended claims. Although the inventions have been described in accordance with the embodiments shown, one of ordinary skill in the art will readily recognize that there could be variations to the embodiments and those variations would be within the spirit and scope of the present inventions. Accordingly, many modifications may be made by one of ordinary skill in the art without departing from the spirit and scope of the appended claims.

According to various embodiments, there is provided: A transient current blocking unit, comprising: a pair of self-bootstrapping diodes connected together in series with opposed polarities; wherein each said diode is optimized for a maximum current density, under reverse bias, which is more than ten times the maximum current density which would occur in said diode if optimized for rectification.

According to various disclosed embodiments, there is provided: A transient current blocking unit, comprising: a pair of diodes connected together in series with opposed polarities; at least one of said diodes comprising a semiconductor device which includes: a first semiconductor channel which electrically separates a first semiconductor source of a first conductivity type from a first drift region, and which is gated by a first gate electrode; a second semiconductor channel which electrically separates a second semiconductor source of a second conductivity type from a second drift region, and which is gated by a second gate electrode; said first and second sources being electrically connected together; a first external terminal, which is operatively connected to receive first-type majority carriers through said first drift region, and a second external terminal, which is operatively connected to receive second-type majority carriers through said second drift region; said first gate electrode being operatively connected to receive a potential which is dependent on the potential of said second drift region, and said second gate electrode being operatively connected to receive a potential which is dependent on the potential of said first drift region; wherein each said diode has a maximum current density, under reverse bias, which is more than ten times the maximum current density which would occur in said diode if optimized for rectification.

According to various embodiments, there is provided: A method for limiting transient current between two terminals, comprising the actions of: connecting a pair of diodes in series between said terminals, said diodes being connected with opposed polarities; and when a cathode terminal of either said diode is more negative than an anode terminal thereof, then sinking current from said anode terminal through a first drift region and a first field-effect-gated channel to an n-type source, and also sourcing current to said cathode terminal from a p-type source through a second field-effect-gated channel and a second drift region; said n-type and p-type sources being electrically connected together; said second channel being gated by a second gate electrode which is coupled to said first drift region; and said first channel being gated by a first gate electrode which is coupled to said second drift region; wherein each said diode is optimized for a maximum current density, under reverse bias, which is more than ten times the maximum current density which would occur in said diode if optimized for rectification.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. An apparatus comprising:
    a first field effect device comprising a first source, a first drain, a first gate, and a first semiconductor region positioned in a first drift region of the first field effect device; and
    a second field effect device comprising a second source, a second drain, and a second gate,
    wherein the first drain is electrically connected to the second drain,
    wherein:
        the first source comprises a semiconductor material of a first conductivity type, and the first semiconductor region comprises a semiconductor material of the first conductivity type.

2. The apparatus of claim 1, wherein the first drain is directly electrically connected to the second drain.

3. The apparatus of claim 1, further comprising a conductive layer electrically connected to the first drain and to the second drain.

4. The apparatus of claim 1, further comprising an electrode electrically connected to the first drain and to the second drain.

5. The apparatus of claim 1, wherein the second field effect device further comprises a second semiconductor region positioned in a second drift region of the second field effect device.

6. The apparatus of claim 1, wherein:
the first source is arranged to produce a depletion region in the first drift region when the first field effect device is in a nonconducting state, and
the first semiconductor region is positioned in the first drift region such that the first semiconductor region is within the depletion region when the first field effect device is in the nonconducting state.

7. The apparatus of claim 1, wherein the first semiconductor region is more heavily doped than the first source.

8. An apparatus comprising:
a first field effect device comprising a first source, a first drain, a first gate, and a first semiconductor region positioned in a first drift region of the first field effect device;
a second field effect device comprising a second source, a second drain, and a second gate; and
a third field effect device comprising a third source, a third drain, and a third gate, wherein the first semiconductor region of the first field effect device is electrically connected to the third gate and the first source is electrically connected to the third source,
wherein the first drain is electrically connected to the second drain.

9. The apparatus of claim 8, further comprising:
a first conductive layer electrically connected to the first semiconductor region and the third gate; and
a second conductive layer electrically connected to the first source and the third source.

10. The apparatus of claim 9, wherein:
the third field effect device comprises a third semiconductor region positioned in a third drift region of the third field effect device; and
the apparatus further comprises a third conductive layer electrically connected to the third semiconductor region and the first gate.

11. The apparatus of claim 10, wherein:
the second field effect device comprises a second semiconductor region positioned in a second drift region of the second field effect device; and
the apparatus further comprises:
a fourth field effect device comprising a fourth source, a fourth drain, a fourth gate, and a fourth semiconductor region positioned in a fourth drift region of the fourth field effect device;
a fourth conductive layer electrically connected to the second gate and to the fourth semiconductor region; and
a fifth conductive layer electrically connected to the fourth gate and to the second semiconductor region.

12. The apparatus of claim 11, further comprising:
a first external terminal electrically connected to the third drain of the third field effect device; and a second external terminal electrically connected to the fourth drain of the fourth field effect device,
wherein the apparatus is arranged to provide to a load connected to the second external terminal protection from a surge event occurring in a circuit connected to the first external terminal.

13. The apparatus of claim 12, wherein the apparatus is a device having only two external terminals.

14. The apparatus of claim 1, wherein the drift region in which the first semiconductor region is positioned is a drift region to carry current between the first source and the first drain when the first field effect device is in a conducting state.

15. An apparatus comprising:
a first field effect device comprising a first source, a first drain, a first gate, and a first semiconductor region positioned in a first drift region of the first field effect device; and
a second field effect device comprising a second source, a second drain, and a second gate,
wherein:
the first drain is electrically connected to the second drain;
the first field effect device further comprises a body region;
the first source is positioned in the body region; and
the drift region is a portion of the body region.

16. An apparatus comprising:
a first field effect device comprising a first source, a first drain, a first gate, and a first semiconductor region positioned in a first drift region of the first field effect device; and
a second field effect device comprising a second source, a second drain, and a second gate,
wherein:
the first drain is electrically connected to the second drain;
the first field effect device further comprises a bulk region; and
the drift region is a portion of the bulk region.

17. An apparatus comprising:
a first field effect device comprising a first source, a first drain, a first gate, and a first semiconductor region positioned in a first drift region of the first field effect device;
a second field effect device comprising a second source, a second drain, a second gate, and a second semiconductor region positioned in a second drift region of the second field effect device;
a third field effect device comprising a third source, a third drain, and a third gate, wherein the first semiconductor region of the first field effect device is electrically connected to the third gate and the first source is electrically connected to the third source; and
a fourth field effect device comprising a fourth source, a fourth drain, and a fourth gate, wherein the second semiconductor region of the second field effect device is electrically connected to the fourth gate and the second source is electrically connected to the fourth source.

18. The apparatus of claim 17, wherein:
the third field effect device further comprises a third semiconductor region positioned in a third drift region of the third field effect device; and
the third semiconductor region is electrically connected to the first gate of the first field effect device.

19. The apparatus of claim 18, wherein:
the fourth field effect device further comprises a fourth semiconductor region positioned in a fourth drift region of the fourth field effect device; and the fourth semiconductor region is electrically connected to the second gate of the second field effect device.

20. The apparatus of claim 17, wherein:
the first field effect device and the third field effect device have different channel conductivity types; and
the second field effect device and the fourth field effect device have different channel conductivity types.

21. The apparatus of claim 17, wherein:
the drain of the first field effect device is electrically connected to a first external terminal of the apparatus;
the drain of the third field effect device is electrically connected to the drain of one of the second field effect device or the fourth field effect device; and
the drain of the other of the second field effect device or the second field effect device is connected to a second external terminal of the apparatus.

22. The apparatus of claim 17, wherein:
the drain of the third field effect device is electrically connected to a first external terminal of the apparatus;
the drain of the first field effect device is electrically connected to the drain of one of the second field effect device or the fourth field effect device; and
the drain of the other of the second field effect device or the second field effect device is connected to a second external terminal of the apparatus.

23. The apparatus of claim 21 or claim 22, wherein the apparatus is arranged to provide to a load connected to the second external terminal protection from a surge event occurring in a circuit connected to the first external terminal.

24. The apparatus of claim 21 or claim 22, wherein the apparatus is a device having only two external terminals.

25. The apparatus of claim 17, further comprising:
a first device having a first conductive region and a second conductive region, the first device comprising the first field effect device and the third field effect device, the first device being arranged to conduct current in two directions, the first device having a lower voltage drop when conducting current from the first conductive region to the second conductive region than when conducting current from the second conductive region to the first conductive region; and
a second device having a third conductive region and a fourth conductive region, the second device comprising the second field effect device and the fourth field effect device, the second device being arranged to conduct current in two directions, the second device having a lower voltage drop when conducting current from the third conductive region to the fourth conductive region than when conducting current from the fourth conductive region to the third conductive region,
wherein the second conductive region is electrically connected to the fourth conductive region.

26. The apparatus of claim 25, wherein:
the drain of the first field effect device is electrically connected to the first conductive region;
the drain of the second field effect device is electrically connected to the third conductive region;
the drain of the third field effect device is electrically connected to the second conductive region; and
the drain of the fourth field effect device is electrically connected to the fourth conductive region.

27. The apparatus of claim 25, wherein the second conductive region and the fourth conductive region are portions of a same conductive region.

28. An apparatus comprising:
a first transient blocking circuit (TBC) adapted to conduct current in a first direction between a first conductive region and a second conductive region and in a second direction between the second conductive region and the first conductive region, the first TBC having a lower voltage drop in the first direction than in the second direction, the first TBC comprising a first field effect device comprising a first source, a first drain, a first gate, and a first semiconductor region disposed in a first drift region of the first field effect device; and
a second TBC adapted to conduct current in a third direction between a third conductive region and a fourth conductive region and in a fourth direction between the fourth conductive region and the third conductive region, the second TBC having a lower voltage drop in the third direction than in the fourth direction, the second TBC comprising a second field effect device comprising a second source, a second drain, a second gate, and a second semiconductor region disposed in a second drift region of the second field effect device,
wherein the second conductive region is electrically connected to the fourth conductive region, and
wherein the apparatus comprises only two external terminals, a first external terminal being electrically connected to the first conductive region and a second external terminal being electrically connected to the third conductive region.

29. The apparatus of claim 28, wherein the first drain of the first field effect device is electrically connected to the first conductive region.

30. An apparatus comprising:
a first transient blocking circuit (TBC) adapted to conduct current in a first direction between a first conductive region and a second conductive region and in a second direction between the second conductive region and the first conductive region, the first TBC having a lower voltage drop in the first direction than in the second direction, the first TBC comprising a first field effect device comprising a first source, a first drain, a first gate, and a first semiconductor region disposed in a first drift region of the first field effect device; and
a second TBC adapted to conduct current in a third direction between a third conductive region and a fourth conductive region and in a fourth direction between the fourth conductive region and the third conductive region, the second TBC having a lower voltage drop in the third direction than in the fourth direction, the second TBC comprising a second field effect device comprising a second source, a second drain, a second gate, and a second semiconductor region disposed in a second drift region of the second field effect device,
wherein:
the second conductive region is electrically connected to the fourth conductive region;
the first TBC further comprises a third field effect device, the third field effect device comprising a third source, a third drain, and a third gate, wherein the first semiconductor region of the first field effect device is electrically connected to the third gate and the first source is electrically connected to the third source; and
the second TBC further comprises a fourth field effect device, the fourth field effect device comprising a fourth source, a fourth drain, and a fourth gate, wherein the second semiconductor region of the second field effect device is electrically connected to the fourth gate and the second source is electrically connected to the fourth source;

the first field effect device and the third field effect device have different channel conductivity types; and the second field effect device and the fourth field effect device have different channel conductivity types.

31. An apparatus comprising:
a first field effect device, the first field effect device comprising a trench, a first gate positioned in the trench, a first source positioned alongside the trench, a first drain, and a first semiconductor region positioned in a drift region of the first field effect device and alongside the trench;
a second field effect device, the second field effect device comprising a second gate, a second source, and a second drain, wherein the first semiconductor region of the first field effect device is electrically connected to the second drain; and
an electrode electrically connected to the first gate and the second drain.

32. The apparatus of claim 31, wherein the first field effect device and the second field effect device are integrated.

33. The apparatus of claim 31, further comprising an electrode electrically connected to the first source and the second source.

34. The apparatus of claim 31, wherein:
the electrode is a first electrode;
the apparatus further comprises a second electrode electrically connected to the drain; and
the first electrode and the second electrode are each connected to an external terminal of the apparatus.

35. The apparatus of claim 34, wherein the apparatus is a device having only two external terminals.

36. The apparatus of claim 31, wherein the first field effect device and the second field effect device have opposite conductivity types.

37. The apparatus of claim 31, wherein:
the second field effect device further comprises a second trench; and
the second gate is positioned in the second trench.

38. The apparatus of claim 31, wherein the drift region in which the first semiconductor region is positioned is a drift region to carry current between the first source and the first drain when the first field effect device is in a conducting state.

39. The apparatus of claim 31, wherein the first semiconductor region is arranged to produce, when the first field effect device is in a nonconducting state, a signal indicating that the first field effect device is in the nonconducting state.

40. The apparatus of claim 39, wherein the first semiconductor region is arranged to control a conductivity of the second field effect device by providing the signal to the second gate of the second field effect device.

41. The apparatus of claim 31, wherein the first field effect device is a UMOS field effect device.

42. An apparatus comprising:
a first field effect device, the first field effect device comprising a trench, a first gate positioned in the trench, a first source positioned alongside the trench, a first drain, and a first semiconductor region positioned in a drift region of the first field effect device and alongside the trench; and
a second field effect device, the second field effect device comprising a second gate, a second source, and a second drain, wherein the first semiconductor region of the first field effect device is electrically connected to the second drain, wherein:
the first field effect device further comprises a body region;
the first source is positioned in the body region; and
the drift region is a portion of the body region.

43. An apparatus comprising:
a first field effect device, the first field effect device comprising a trench, a first gate positioned in the trench, a first source positioned alongside the trench, a first drain, and a first semiconductor region positioned in a drift region of the first field effect device and alongside the trench; and
a second field effect device, the second field effect device comprising a second gate, a second source, and a second drain, wherein the first semiconductor region of the first field effect device is electrically connected to the second drain, wherein:
the first field effect device further comprises a bulk region; and
the drift region is a portion of the bulk region.

44. A method of producing a field effect device, comprising:
forming a trench in a first semiconductor region;
forming a gate insulator in the trench;
forming a gate in the trench;
forming a first conduction terminal for the field effect device in the first semiconductor region adjacent to the trench, the first conduction terminal comprising a semiconductor material of a first conductivity type;
forming a second conduction terminal for the field effect device at a position separated from the trench by a portion of the first semiconductor region, the second conduction terminal comprising a semiconductor material of the first conductivity type; and
forming a third semiconductor region of the first conductivity type alongside the trench and in the first semiconductor region.

45. The method of claim 44, wherein forming the third semiconductor region of the first conductivity type comprises forming the third semiconductor region at a position separated from the gate by the gate insulator.

46. The method of claim 44, further comprising forming a second field effect device integrated with the field effect device, wherein forming the second field effect device comprises:
forming a second gate for the second field effect device;
forming a third conduction terminal for the second field effect device in the first semiconductor region, the third conduction terminal comprising a semiconductor material of a second conductivity type different from the first conductivity type; and
forming a fourth conduction terminal for the second field effect device in the first semiconductor region, the fourth conduction terminal comprising a semiconductor material of the second conductivity type.

47. The method of claim 46, wherein the first semiconductor region is an epitaxial layer.

48. The method of claim 46, further comprising forming a conductive region electrically connecting the third semiconductor region to the second gate for the second field effect device.

49. The method of claim 46, wherein forming the gate insulator in the trench comprises forming an insulator region to act as the gate insulator of the field effect device and the gate insulator of the second field effect device.

50. The method of claim 46, wherein forming the second gate comprises:
   forming a second trench in the first semiconductor region; and
   forming the second gate in the second trench.

51. The method of claim 46, further comprising forming a conductive region electrically connecting the third conduction terminal and the first conduction terminal.

52. The method of claim 46, wherein:
   forming the first conduction terminal comprises forming a source of the field effect device;
   forming the second conduction terminal comprises forming a drain of the field effect device;
   forming the third conduction terminal comprises forming a source of the first field effect device; and
   forming the fourth conduction terminal comprises forming a drain of the second field effect device.

53. The method of claim 41, wherein forming the third semiconductor region comprises forming the third semiconductor region adjacent to a bottom of the trench.

54. The method of claim 41, wherein forming the third semiconductor region comprises forming the third semiconductor region in a drift region of the field effect device.

55. The method of claim 54, wherein forming the third semiconductor region comprises forming the third semiconductor region in at a position that, when the field effect device is in a non-conducting state, will be in a depletion region of the field effect device.

* * * * *